(12) United States Patent
Huffstetler, Jr.

(10) Patent No.: US 7,200,371 B1
(45) Date of Patent: Apr. 3, 2007

(54) INTER-MODULATION INTERFERENCE INHIBITING LINE AMPLIFIER

(76) Inventor: George A Huffstetler, Jr., 3424 S. 75th W Ave., Tulsa, OK (US) 74107

( * ) Notice: Subject to any disclaimer, the term of this patent is extended or adjusted under 35 U.S.C. 154(b) by 657 days.

(21) Appl. No.: 10/013,002

(22) Filed: Nov. 5, 2001

Related U.S. Application Data (60) Provisional application No. 60/246,556, filed on Nov. 7, 2000.

(51) Int. Cl.
*H01Q 11/12* (2006.01)

(52) U.S. Cl. ............... 455/127.2; 455/126; 455/127.1; 455/127.3

(58) Field of Classification Search ............... 455/126, 455/127.1, 127.2, 127.3, 295
See application file for complete search history.

(56) References Cited

U.S. PATENT DOCUMENTS 5,339,057 A * 8/1994 Rauscher .................... 333/166

6,531,931 B1 * 3/2003 Benyamin et al. ............ 333/18

OTHER PUBLICATIONS

Brochure, Shiron Satellite Communications (1996) Ltd., Petach Tikva, Israel (undated).

* cited by examiner

*Primary Examiner*—Barry Taylor
(74) *Attorney, Agent, or Firm*—Greenberg Traurig, LLP (57) ABSTRACT

Systems and methods are provided for using an inter-modulation interference inhibiting line amplifier that reduces signal losses for signals transmitted between a transmitting element and a receiving element. The present invention inhibits inter-modulation interference by separating the component signals of a transmitted signal into their component parts. The component signals are then adjusted for signal losses. Such adjusting includes amplification, equalization, and passing component signals through a gain control stage. The component signals are then recombined and transmitted to a receiving element or another line amplifier. The signal received by the line amplifier may be a signal transmitted by a transmitting element or another line amplifier.

5 Claims, 8 Drawing Sheets

INTER-MODULATION INTERFERENCE INHIBITING LINE AMPLIFIER

This application claims the benefit of U.S. Provisional Patent Application No. 60/246,556 filed on Nov. 7, 2000.

BACKGROUND OF THE INVENTION

This invention relates to amplifiers for use in communications systems and, more particularly, to amplifiers that inhibit or reduce inter-modulation interference in composite signals.

In some communications systems such as, for example, very small aperture transmission (VSAT) systems, modulated-information signals are typically transmitted with other component signals in a composite signal. In a VSAT system, the other component signals may be, for example, a clock signal and DC power.

When a long cable is needed to couple two elements in a communications system (e.g., a transmitter to a receiver, an antenna to a downlink or an uplink converter) signal losses due to noise, dielectric loss, resistivity, and interference in the cable may reduce the composite signal to an unusable level. These losses may increase as the frequency of the transmitted signals increase. More energy may be dissipated as the frequency increases. When standard low-cost off-the-shelf line amplifiers are used to adjust or compensate for these signal losses, the component signals may interfere with each other rendering the composite signal unusable. This inter-signal interference is sometimes referred to as "inter-modulation" interference.

It is therefore an object of the present invention to provide a line amplifier that inhibits or reduces inter-modulation interference.

SUMMARY OF THE INVENTION

This and other objects are accomplished in accordance with the principles of the present invention by providing systems and methods for adjusting composite signals while reducing or inhibiting inter-modulation interference between a modulated-information signal and another component signal. Various features and embodiments of the present invention are described, for example, in Huffstetler, Jr., U.S. Provisional Patent Application No. 60/246,556, which is hereby incorporated by reference herein in its entirety.

In various embodiments, composite signals having two or more component signals are transmitted between receiving elements and transmitting elements over wired or wireless communications links. Transmitting elements and receiving elements may be, for example, antennas, downlink or uplink converters, gateways, upconverters, or line amplifiers. Embodiments of the present invention may be used in a communications system that transmit composite signals that include a modulated-information signal. In particular, embodiments of the present invention may be used in communications systems that include a modulated-information signal and a clock signal. Such a communications system may be, for example, a very small aperture transmission (VSAT) system.

A receiving element and a transmitting element may be connected to other equipment or communications networks such as, for example, computers, telephones, video equipment, electronic private automatic branch exchanges (EPABXs), antennas, local area networks (LANs), or any other suitable equipment or network. For example, the line amplifier and other equipment may be part of any suitable network. Any suitable network topology may be used such as, for example, a star topology (e.g., point-to-multipoint), a mesh topology (e.g., point-to-point), a ring topology, any other suitable topology, or any combination of the same (e.g., a hybrid topology). These networks may include any number of transmitting elements and receiving elements and any number of line amplifiers.

The composite signals transmitted between two elements in a communications system (generally, between a transmitting element and a receiving element) may be filtered by a first set of filters such that the individual component signals of the composite signal are separated. In another suitable approach, filters may be used such that not all of the individual component signals are individually filtered. In these approaches, the component signals that could potentially interfere with one another should be separated such that they can be adjusted separately.

After the component signals have been filtered, they may then be adjusted by the line amplifier. The adjusting may include the amplification of the component signals, the equalization of the component signals, passing the component signals through a gain control stage, any other suitable adjustment of the component signals, any other suitable approach for compensating for signal losses, or any combination of the same.

In some embodiments, the amplitude of the component signals received by a subsequent piece of equipment may be insubstantially different from the signal transmitted by the transmitting element except that the amplitude level may be different. If, for example, a receiving element needs more drive than the signal transmitted by the transmitting element provides, the line amplifier may increase the amplitude of the signal transmitted by the transmitting element. A signal of the appropriate level may then be received by the receiving element.

After the component signals have been adjusted, they may be combined. The combined signal may be a signal that is usable by a subsequent piece of equipment (e.g., a receiving element, an upconverter, an antenna, a downlink converter, an uplink converter). In some embodiments, prior to the combination of the component signals, the component signals may be filtered again by a second set of filters to prevent component signals from returning through the line amplifier to an amplifier not associated with that particular component signal upon their combination. That is, the second set of filters may further prevent the modulated-information signal and another component signal such as a clock signal from being amplified together and cause inter-modulation interference.

The second set of filters may filter the adjusted component signals individually, or filter the adjusted component signals such that not all of the adjusted component signals are filtered individually. In those embodiments in which not all of the adjusted component signals are filtered individually, the adjusted component signals that could potentially interfere with each other when amplified together should be filtered separately.

BRIEF DESCRIPTION OF THE DRAWINGS

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
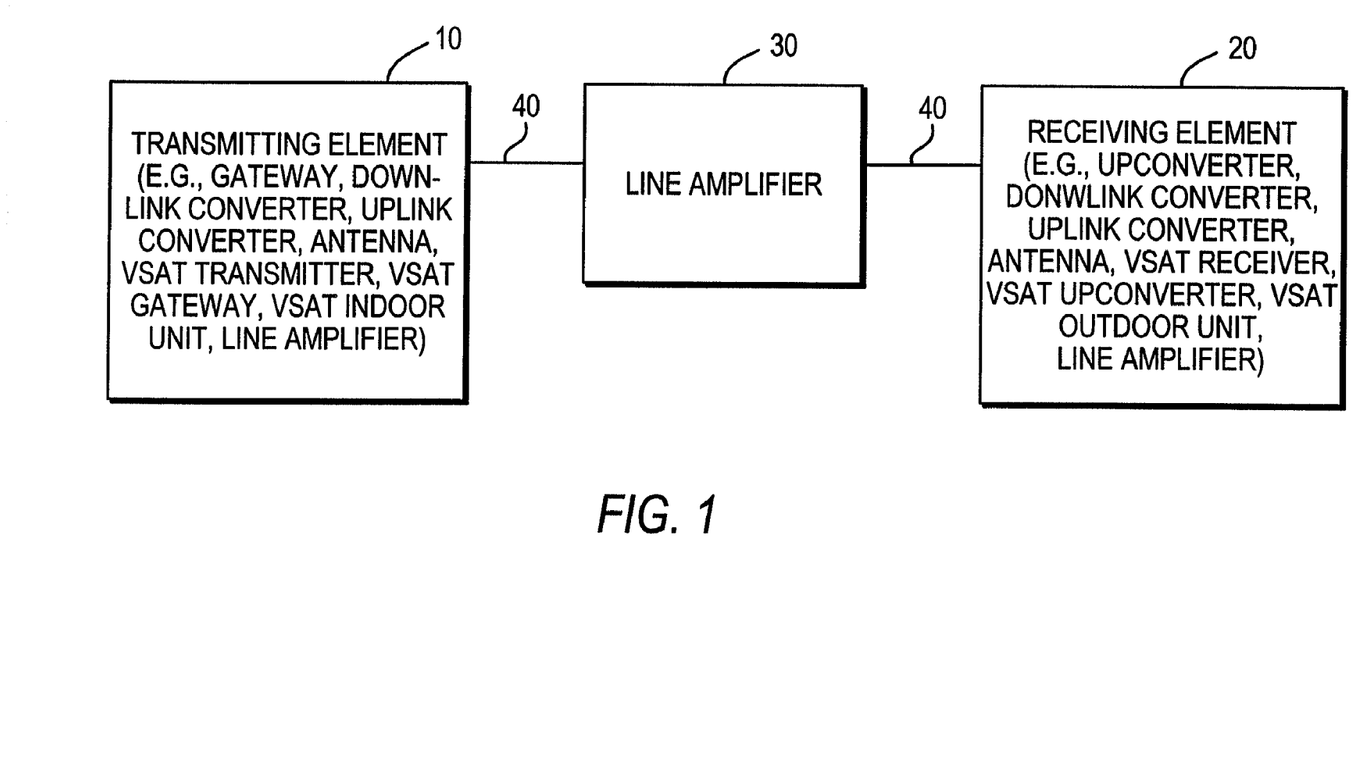
FIG. 1 is a block diagram illustrating where a line amplifier may be positioned relative to a transmitting element and a receiving element in accordance with one embodiment of the present invention.

An illustrative arrangement for coupling two elements in a communications system for communicating composite signals is shown in FIG. 1. The line amplifier of the present invention may be used to reduce signal losses in a cable coupling composite signals between a transmitting element and a receiving element (e.g., a transmitter and a receiver, an antenna and a downlink or an uplink converter, a gateway and an upconverter) while inhibiting or reducing inter-modulation interference between composite signals.

The composite signal may include any suitable number of component signals. In some communications systems, such as a very small aperture transmission (VSAT) system, the composite signal may include three component signals—a modulated-information signal (e.g., an L-Band modulated signal), a clock signal (e.g., a 10 MHz signal), and DC power. Losses may occur in the component signals due to, for example, noise, dielectric loss, resistivity, and interference in the cables coupling the transmitting element and the receiving element. Other variables may also contribute to these losses. These losses may increase as the frequency of the transmitted signals increase.

When standard low-cost off-the-shelf line amplifiers are used to compensate for these signal losses, the modulated-information signal and the clock signal are amplified together. Amplifying a modulated-information signal and a clock signal together may cause the signals to interfere with each other rendering the signals unusable. Such a phenomenon is commonly referred to as inter-modulation interference.

As shown in FIG. 1, a line amplifier 30 may be coupled between transmitting element 10 and receiving element 20. Line amplifier 30 may be coupled to transmitting element 10 and receiving element 20 such that, for example, line amplifier 30 is downstream of transmitting element 10 and upstream of receiving element 20. Line amplifier 30 may be coupled to transmitting element 10 and receiving element 20 using any suitable wired paths. Such paths may be, for example, paths 40. Paths 40 may be coaxial cables, twisted pair cables, any other suitable cables, or any combination of the same.

Figure 2:
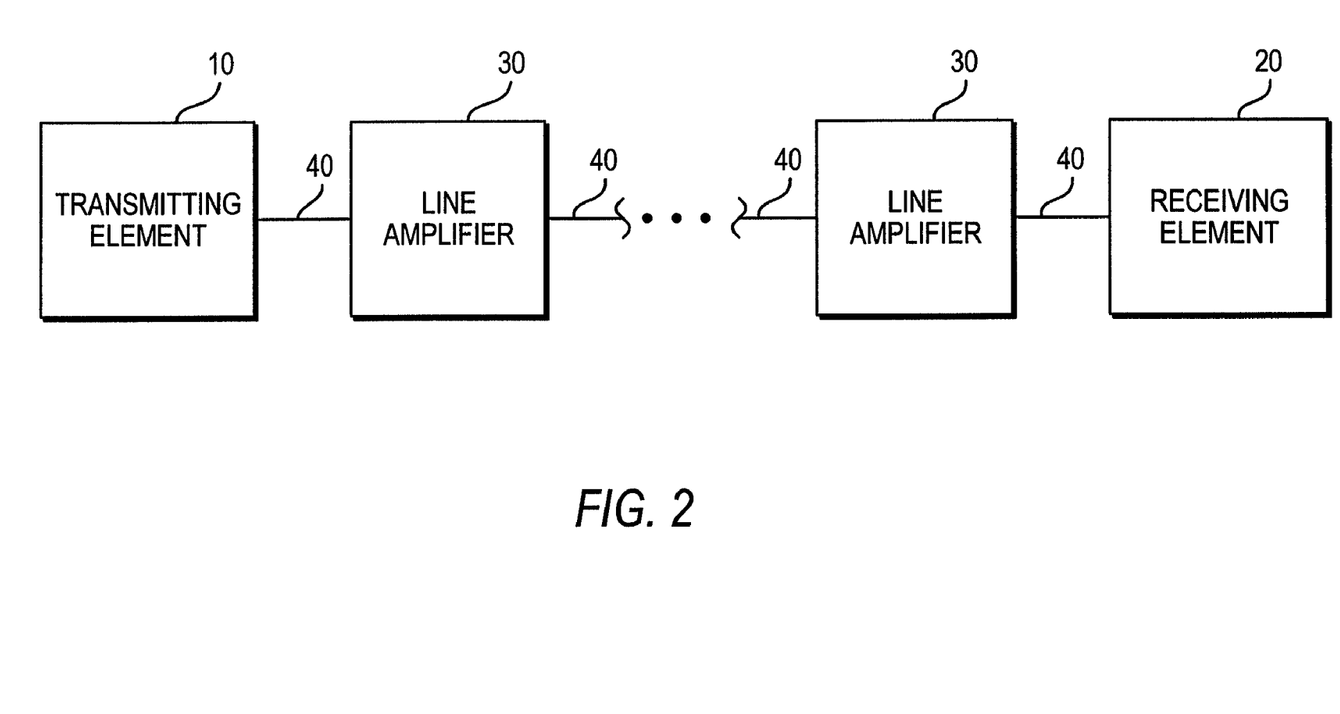
FIG. 2 is a block diagram illustrating that several line amplifiers may be placed between a transmitting element and a receiving element in accordance with one embodiment of the present invention.

When a transmitting element and a receiving element are coupled by a large amount of cable such that a single line amplifier is insufficient, it may be desirable to place multiple line amplifiers between the transmitting element and the receiving element. As shown in FIG. 2, for example, the signal transmitted by transmitting element 10 may be amplified by more than one line amplifier before it is received by receiving element 20. That is, any suitable number of line amplifiers 30 may be placed between a transmitting element 10 and a receiving element 20. Transmitting element 10, receiving element 20, and line amplifiers 30 may be arranged in any suitable way such that the component signals transmitted by transmitting element 10 are at a suitable level for use by receiving element 20. The arrangement shown in FIG. 2 is known as a cascade.

Transmitting element 10, receiving element 20, and line amplifiers 30 may be coupled by paths 40. Paths 40 may be coaxial cables, twisted pair cables, any other suitable cable, or any combination of the same.

Line amplifiers, transmitting elements, and receiving elements may be part of any suitable network. Such networks may adopt any suitable topology. Such a suitable topology may include, for example, a star (or tree) topology (e.g., point-to-multipoint), a mesh topology (e.g., point-to-point), a ring topology, any other suitable topology, or any combination of the same (e.g., a hybrid topology). These networks may include any number of transmitting elements, receiving elements, and line amplifiers.

Figure 3:
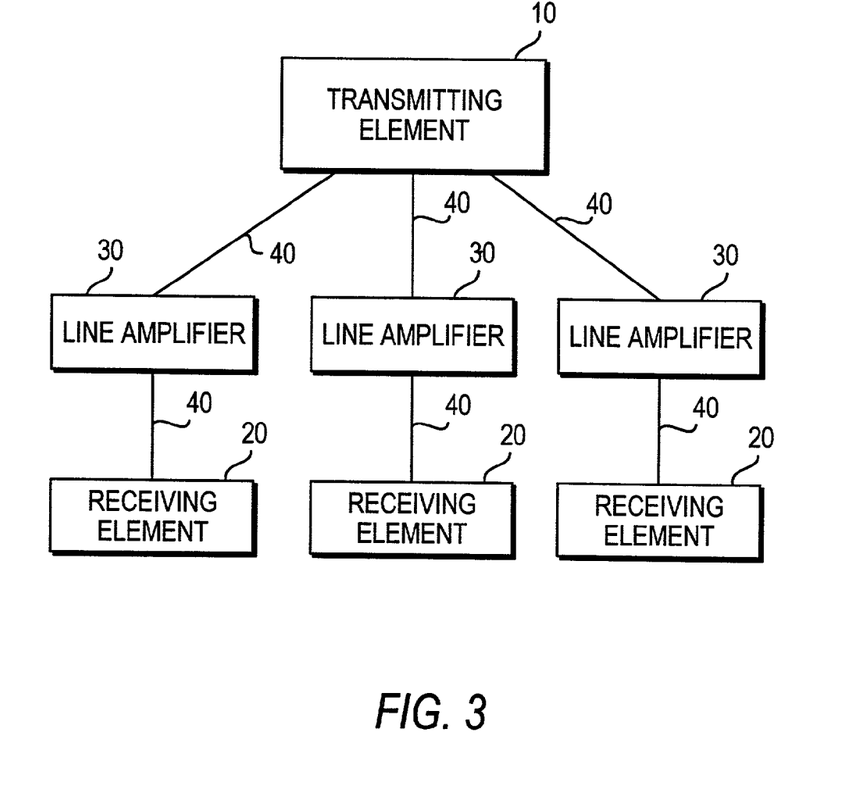
FIG. 3 is a block diagram illustrating a star topology in accordance with one embodiment of the present invention.

FIG. 3 illustrates a star topology (e.g., point-to-multipoint topology). As shown, a transmitting element 10 may transmit information to multiple receiving elements 20. One, or more than one, line amplifier 30 may be placed between the transmitting element 10 and a receiving element 20. In a star topology, transmitting element 10, receiving element 20, and line amplifiers 30 may be coupled by paths 40. Paths 40 may be coaxial cables, twisted pair cables, any other suitable cables, or any combination of the same.

Figure 4:
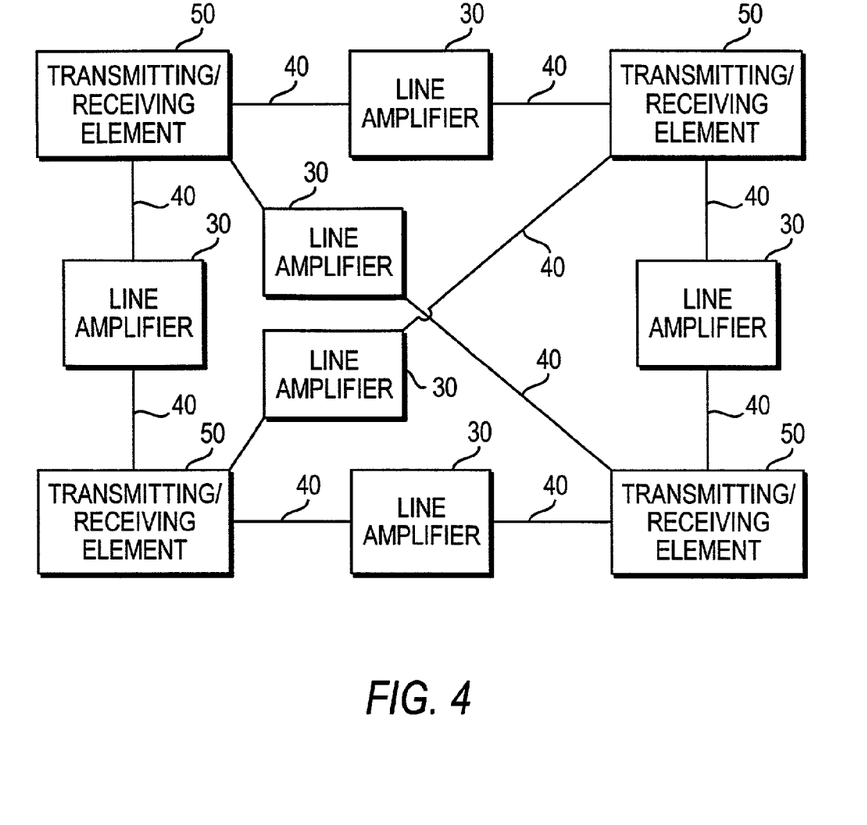
FIG. 4 is a block diagram illustrating a mesh topology in accordance with one embodiment of the present invention.

FIG. 4 illustrates a mesh topology (e.g., point-to-point topology). As shown, signals may be transmitted between transmitting/receiving elements 50. Transmitting/receiving elements 50 may include the functionality of both a transmitting element and a receiving element. One, or more than one, line amplifier 30 may be placed between transmitting/receiving elements 50. Transmitting/receiving elements 50 and line amplifiers 30 may be coupled by paths 40. Paths 40 may be coaxial cables, twisted pair cables, any other suitable cables, or any combination of the same.

Figure 5:
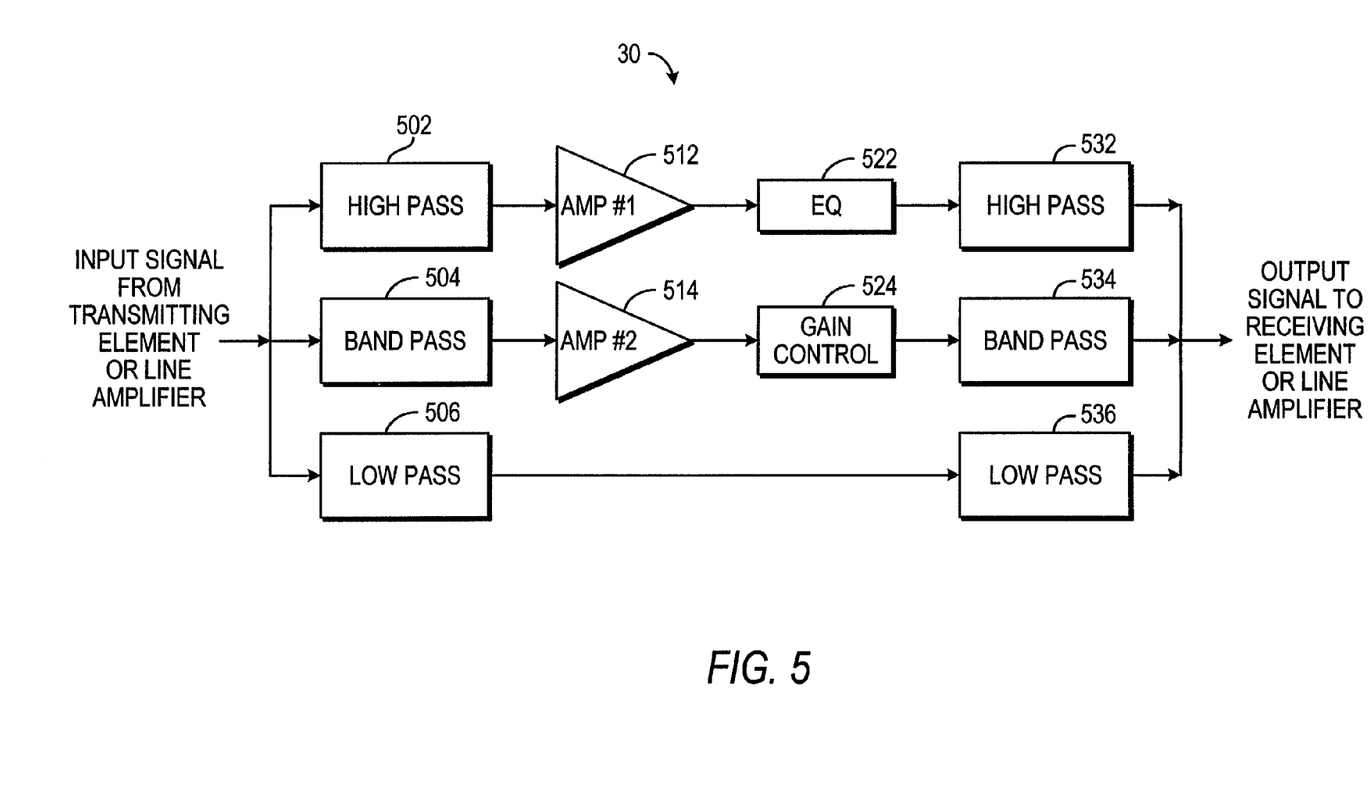
FIG. 5 is a block diagram of an illustrative line amplifier in accordance with one embodiment of the present invention.

FIG. 5 shows an illustrative arrangement of line amplifier 30 (FIG. 1). As shown, an input signal (i.e., a composite signal from a transmitting element 10 or another line amplifier 30) may be filtered by a first set of filters: a high pass filter 502, a band pass filter 504, and a low pass filter 506. Although the first set of filters of line amplifier 30 of FIG. 5 is shown with only three filters, it is to be understood that the first set of filters may include any suitable number of filters having suitable frequency ranges.

The input composite signal from a transmitting element 10 or line amplifier 30 may be filtered by the first set of filters to separate one or more of the component signals out of the input composite signal. In general, one or more signals should be separated out so that component signals can be amplified without causing inter-modulation interference. In a VSAT system, for example, a modulated-information signal, a clock signal, and a DC power signal may be separated.

In embodiments where not all of the signals are individually filtered, those component signals that could potentially interfere with each other when amplified together (e.g., a modulated-information signal and a clock signal) should be separated so that they can be amplified separately.

Low pass filter 506 may allow only, for example, a low frequency or DC signal to pass. DC power may be transmitted on the conductor of the cable or cables coupling transmitting element 10 and receiving element 20. The DC power on the conductor may be used to power any suitable component of line amplifier 30, receiving element 20, or any other subsequent piece of equipment. Low pass filter 506 may output any suitable DC voltage signal such as a 5, 9 or 10 volt DC signal. Low pass filter 506 may have any suitable frequency range. Such a range may be, for example, DC to 5 KHz.

Band pass filter 504 may allow only, for example, a signal with a given frequency range such as a clock signal (e.g., a 10 MHz clock signal) to pass. For a 10 MHz clock signal, such a range may be, for example, 9 to 11 MHz.

High pass filter 502 may allow only a high-frequency signal such as a modulated-information signal, to pass. Such signals may include, for example, signals in the ultra high frequency (UHF) range, signals in the very high frequency (VHF) range, L-Band, Ku-Band, C-Band, and other suitable signals. The modulated-information signal may include any suitable information. Such information may be, for example, voice information, video information, communications information such as protocols, Internet related information, any other suitable information, or any combination of the same. High pass filter 502 may have any suitable frequency range. For an L-Band modulated signal, such a range may be, for example, 950 to 1750 MHz.

The output of low pass filter 506, DC power, may also power amplifier 512 and amplifier 514. When the output of low pass filter 506 is used to power amplifiers 512 and 514, low pass filter 506 may be necessary to prohibit other signals (e.g., a modulated-information signal, a clock signal) from attempting to power amplifiers 512 and 514.

The output of high pass filter 502 may be fed to amplifier 512. The output of band pass filter 504 may be fed to amplifier 514. Amplifiers 512 and 514 may amplify the outputs of high pass filter 502 and band pass filter 504, respectively. Amplifiers 512 and 514 may have any suitable gain to adjust and compensate for the different losses in the component signals. In this example, the modulated-information signal and the clock signal are passed to amplifiers 512 and 514, respectively. Amplifiers 512 and 514 may be static or variable gain amplifiers.

In some embodiments, the component signals transmitted by a transmitting element may be adjusted such that the signals received by a receiving element are insubstantially different than the component signals transmitted by a transmitting element.

In some embodiments, line amplifier 50 may adjust or compensate for the amplitude of a signal transmitted by a transmitting element. If the receiving element needs more drive than the signal transmitted by the transmitting element provides, for example, any suitable element such as amplifiers 512 and 514 may increase the amplitude of the component signals transmitted by the transmitting element. The component signals received by the receiving element may thus be of the appropriate level.

Amplifiers 512 and 514 may be any suitable amplifiers that can amplify the signal passed by the filter associated with the amplifier (i.e., the signal passed by filters 502 and 504, respectively). For example, amplifier 512 may be any suitable wide band 50 ohm amplifier. Such a suitable amplifier may be model number ERA-5SM made by Mini-Circuits®. Amplifier 514 may be any suitable configuration of resistors, capacitors, and bipolar transistors. Amplifier 514 may also include operational amplifiers. An illustrative circuit diagram for amplifier 514 is shown in, and described in relation to, FIG. 8. Although line amplifier 30 of FIG. 5 is shown with only two amplifiers, line amplifier 30 may include any suitable number of amplifiers.

The output of amplifier 512, the high pass signal, may be fed to an equalizer 522. Equalizer 522 may equalize the high pass signal. Amplifier 512, equalizer 522, or both may vary the gain over frequency to match the signal losses of the high pass signal over frequency. In some embodiments, amplifier 512, equalizer 522, or both may also adjust the high pass signal such that the high pass signal received by receiving element 20 is insubstantially different than the signal transmitted by transmitting element 10. If desired, the amplitude level of the signal received by receiving element 20 may exceed the amplitude level of the signal transmitted by transmitting element 10.

The output of amplifier 514, the band pass signal, may be fed to a gain control stage 524. Amplifier 514, gain control stage 524, or both may adjust the band pass signal to match the signal losses of those signals in the band pass range (e.g., a clock signal). Gain control stage 524 may be a variable or static gain control stage. Gain control stage 524 may control (e.g., attenuate) the composite signal amplified by amplifier 514 such that the signal is suitable for use by receiving element 20. For example, gain control stage 524 may reduce the amplitude of the composite signal amplified by amplifier 514 to match the cable losses for that composite signal. Amplifier 514, gain control stage 524, or both may adjust the band pass signal such that the band pass signal received by receiving element 20 is insubstantially different than the signal transmitted by transmitting element 10.

The output of equalizer 522 (e.g., an adjusted modulated-information signal), the output of gain control stage 524 (e.g., an adjusted clock signal), and DC power may be filtered by a second set of filters. In particular, the outputs of equalizer 522 and gain control stage 524 may be passed to a high pass filter 532 and a band pass filter 534, respectively. The output of low pass filter 506, DC power, may be passed to a low pass filter 536.

The outputs of the second set of filters may be combined prior to transmission to a receiving element. The second set of filters may filter the individual adjusted component signals to prevent them from going back through the line amplifier upon their combination. If an adjusted component signal went back through the line amplifier to an amplifier not associated with that particular adjusted component signal, the adjusted component signal may be amplified together with another signal. This may cause inter-modulation interference.

The second set of filters may, for example, filter the individual adjusted component signals (e.g., DC power and the outputs of equalizer 522 and gain control stage 524) individually, or filter the component signals such that not all of the adjusted component signals are filtered individually. In those embodiments in which not all of the adjusted component signals are filtered individually, the adjusted component signals that could potentially interfere with each other when amplified together should be filtered separately such that these signals cannot go back through the line amplifier to a component signal amplifier not associated with that particular adjusted component signal.

High pass filter 532, band pass filter 534, and low pass filter 536 may each have any frequency range suitable for passing the respective signals. The range of high pass filter 532, band pass filter 534, and low pass filter 536 may be the same as or different than the range of high pass filter 502, band pass filter 504, and low pass filter 506, respectively. Filters 502, 504, 506, 532, 534, and 536 may be any suitable RLC (resistor-inductor-capacitor) network and may include operational amplifiers. Filters 502, 504, 506, 532, 534, and 536 may be first, second, or any other suitable order filters.

The outputs of high pass filter 532, band pass filter 534 and low pass filter 536 may be combined. The combined outputs may then be output to a receiving element 20 or another line amplifier 30. By way of this arrangement, line amplifier(s) 30 will have properly compensated for the signal losses of the output signal of transmitting element 10. The output signal of transmitting element 10 will therefore be usable by a receiving element 20 even when a long cable is used to couple transmitting element 10 and receiving element 20.

The embodiment shown in FIG. 5 is merely illustrative. Line amplifier 30 may include any suitable amount of filters in the first set of filters to separate the component parts of a composite signal from each other. Line amplifier 30 may also include any suitable amount of adjusting elements to properly adjust the component signals. The second set of filters may also have any suitable amount of filters to prevent adjusted component signals from going back through the line amplifier upon their combination.

Figure 6:
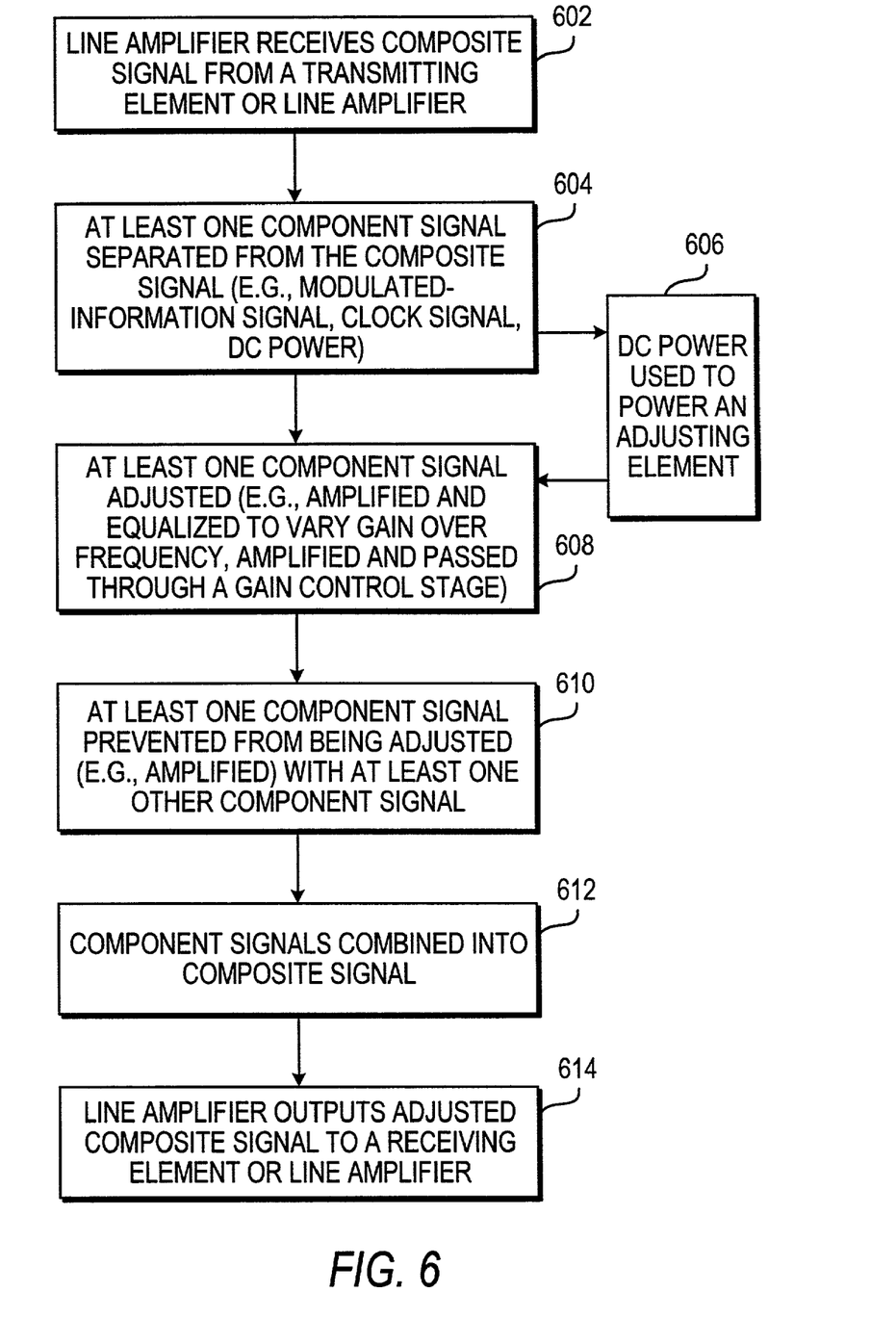
FIG. 6 is a simplified flow chart of illustrative steps involved in adjusting composite signals while inhibiting inter-modulation interference in accordance with one embodiment of the present invention.

FIG. 6 is an illustrative flow chart of a process for adjusting composite signals while inhibiting inter-modulation interference in accordance with one embodiment of the present invention. At step 602, a line amplifier may receive a composite signal from a transmitting element or a line amplifier. At step 604, at least one component signal may be separated from the composite signal (e.g., a modulated-information signal, a clock signal, DC power). In embodiments where a DC power signal is separated out, the DC power may power the adjusting element or elements that adjust a component signal or signals at step 608 (step 606).

At step 608, at least one component signal may be adjusted. Adjusting may include, for example, amplifying and equalizing at least one component signal to vary the gain over frequency to match the signal losses of that component signal over frequency and amplifying and passing at least one component signal through a gain control stage. At step 610, at least one component signal may be prevented from being adjusted with another component signal. At step 612, component signals may be combined into a composite signal. At step 614, the line amplifier may output the composite signal to a receiving element or another line amplifier.

Figure 7:
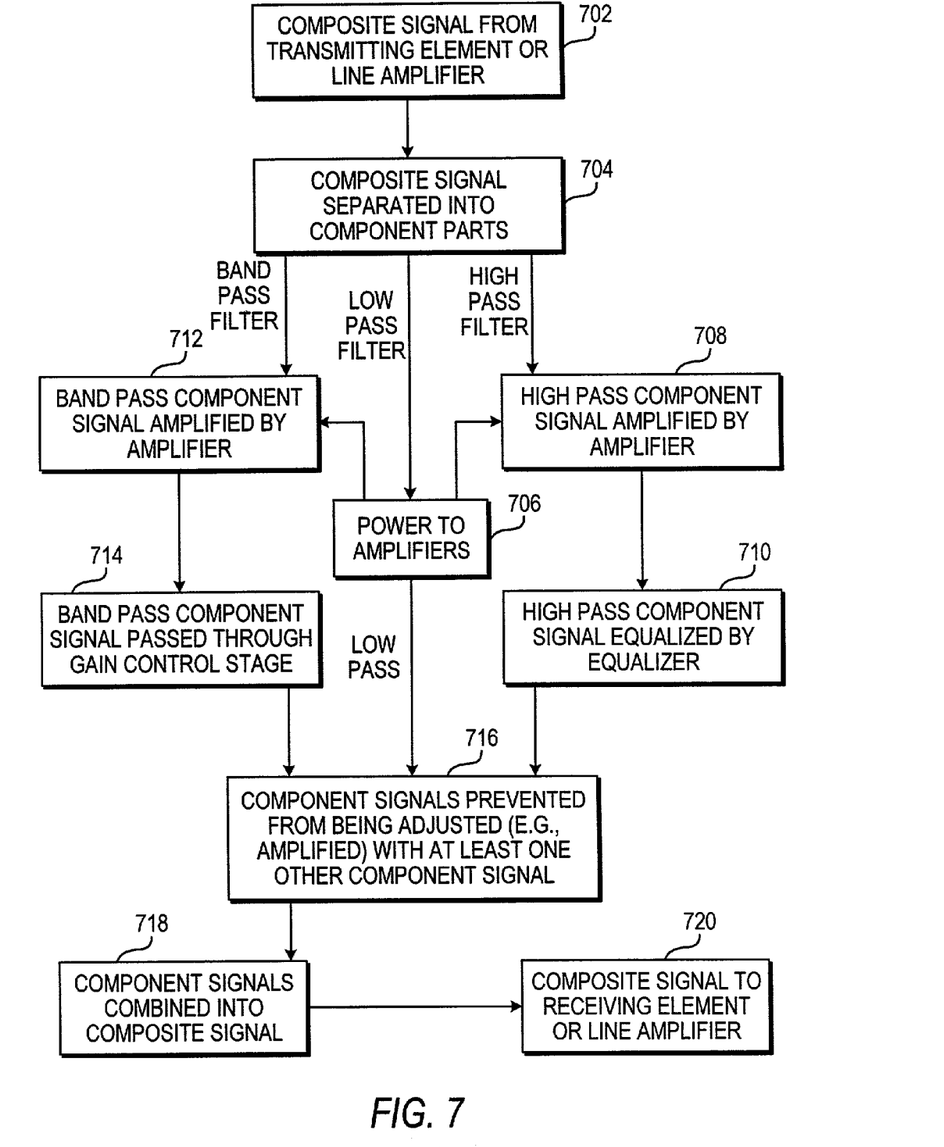
FIG. 7 is a more detailed flow chart of illustrative steps involved in adjusting composite signals while inhibiting inter-modulation interference in accordance with one embodiment of the present invention.

FIG. 7 is a more detailed flow chart of the process for adjusting composite signals while inhibiting inter-modulation interference. At step 702, a line amplifier may receive a composite signal from a transmitting element or a line amplifier. At step 704, the composite signal may be separated into component signals. The composite signal may be separated into component signals using, for example, suitable filters. In this example, the composite signal is separated into a low pass component signal, a band pass component signal, and a high pass component signal.

The low pass component signal output from separating step 704 (e.g., DC power) may be used to power the amplifiers at amplifying steps 708 and 712. This may occur at step 706.

At step 708, the high pass component signal output from separating step 704 may be amplified by an amplifier. At step 710, the high pass component signal may be equalized by an equalizer. The amplification at step 708 and the equalization at step 710 may vary the gain over frequency to match the signal losses of the high pass component signal over frequency. In some embodiments the amplification at step 708 and the equalization at step 710 may also vary the gain over frequency to adjust the high pass component signal such that the high pass component signal transmitted by the transmitting element is insubstantially different than the high pass component signal received by the receiving element.

The band pass component signal output from separating step 704 may also be amplified by an amplifier. This may occur at step 712. The band pass component signal may be passed through a gain control stage—step 714. The amplification at step 712 and the gain control stage at step 714 may adjust the band pass component signal to match the signal losses in the band pass range. In some embodiments, the amplification at step 712 and the gain control stage at step 714 may also adjust the band pass component signal such that the band pass component signal transmitted by the transmitting element is insubstantially different than the band pass component signal received by the receiving element.

The low pass component signal from separating step 704, the output of the equalizer stage, and the output of the gain control stage may be prevented from being adjusted with another component signal (step 716). At step 718, the component signals may be combined into a composite signal. The composite signal may then be transmitted to a receiving element or a line amplifier at step 720.

Figure 8:
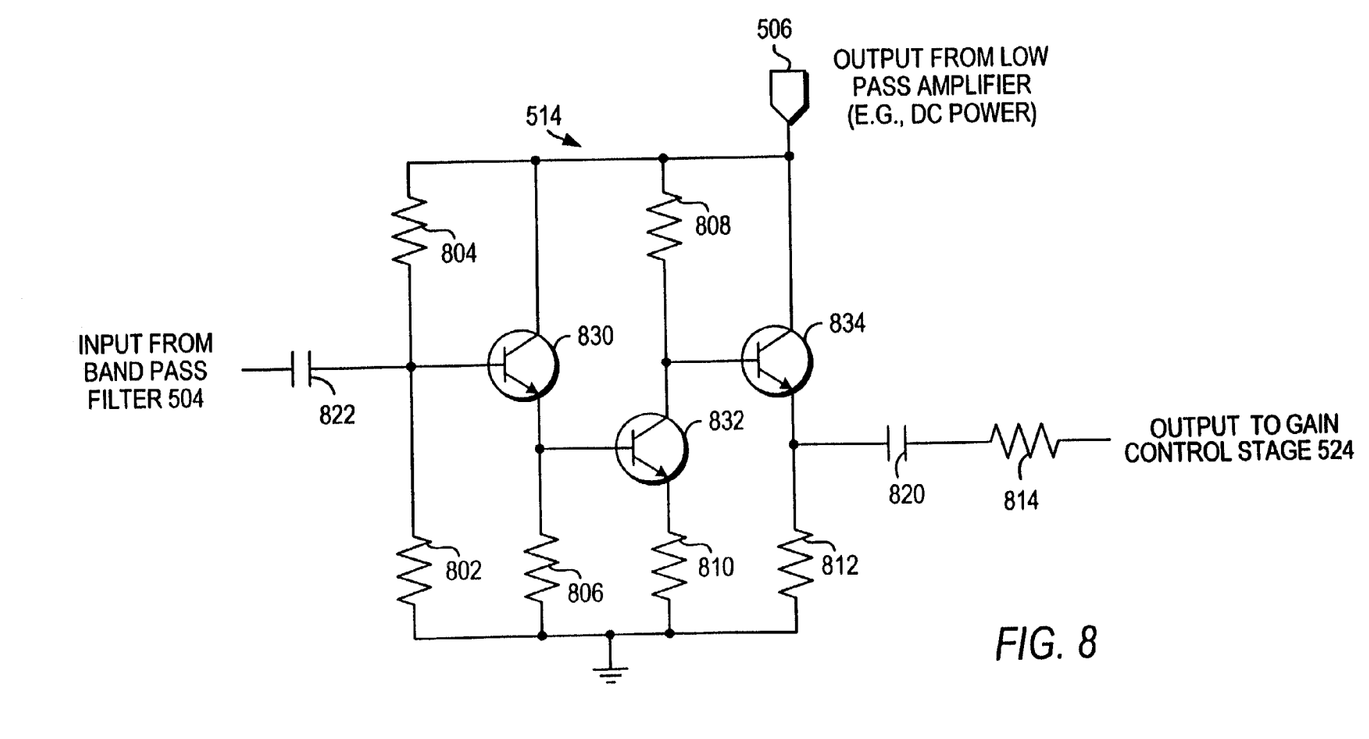
FIG. 8 is an illustrative circuit diagram of a composite signal amplifier in accordance with one embodiment of the present invention.

FIG. 8 is an illustrative circuit diagram of amplifier 514. As shown in FIG. 8, amplifier 514 may receive an input from band pass filter 504. The output of amplifier 514 may be provided to gain control stage 524. The output of low pass amplifier 506, DC power, may power amplifier 514.

Amplifier 514 may include resistors 802, 804, 806, 808, 810, 812, and 814, capacitors 820 and 822, and transistors 830, 832, and 834. Resistors 802, 804, 806, 808, 810, 812, and 814, capacitors 820 and 822 may have any suitable resistance or capacitance. Transistors 830, 832, and 834 may have any suitable parameters. For example, to amplify a 10 MHz signal, capacitors 820 and 822 may have a value of about 5,000 picofarads and resistors 802, 804, 806, 808, 810, 812, and 814, may have values of about 4,700, 12,000, 390, 1,000, 240, 390, and 47 ohms, respectively.

Thus, systems and methods for adjusting composite signals while reducing or prohibiting inter-modulation interference between component signals is provided. One skilled in the art will appreciate that the present invention can be practiced by other than the described embodiments, which are presented for purposes of illustration and not of limitation, and the present invention is limited only by the claims which follow.

What is claimed is:

1. A system for adjusting a composite signal transmitted from a VSAT transmitter to a VSAT receiver, wherein the composite signal includes at least a DC power signal, a clock signal, and a modulated-information signal, the system comprising:

a first set of filters comprising:

a first filter to separate the DC power signal from the composite signal;
a second filter to separate the clock signal from the composite signal; and
a third filter to separate the modulated-information signal from the composite signal;
a first amplifier to amplify the clock signal;
a gain control stage wherein the amplified clock signal is passed through the gain control stage;
a second amplifier to amplify the modulated-information signal;
an equalizer to equalize the amplified modulated-information signal;
a fourth filter to prevent the clock signal from being amplified by the second amplifier;
a fifth filter to prevent the clock signal from being amplified by the first amplifier; and
a signal combiner which receives the modulated-information signal from the fourth filter, the clock signal from the fifth filter, and the DC power signal and outputs a composite signal of the modulated-information signal from the fourth filter, the clock signal from the fifth filter, and the DC power signal.

2. The system defined in claim 1 wherein the VSAT transmitter is a VSAT gateway or a VSAT indoor unit.

3. The system defined in claim 1 wherein the VSAT receiver is a VSAT upconverter, or a VSAT outdoor unit.

4. The system defined in claim 1 wherein the modulated-information signal is amplified and equalized to vary the gain over the frequency to match the signal losses of the modulated-information signal over frequency.

5. The system defined in claim 1 wherein the clock signal is passed through a gain control stage and amplified to adjust the clock signal to match the signal losses of the clock signal.

* * * * *

UNITED STATES PATENT AND TRADEMARK OFFICE
CERTIFICATE OF CORRECTION

| | | |
|---|---|---|
| PATENT NO. | : 7,200,371 B1 | |
| APPLICATION NO. | : 10/013002 | |
| DATED | : April 3, 2007 | |
| INVENTOR(S) | : George A. Huffstetler, Jr. | |

It is certified that error appears in the above-identified patent and that said Letters Patent is hereby corrected as shown below:

Column 9,

Delete lines 16-17 and replace with:

a fifth filter to prevent the modulated-information signal from being amplified by the first amplifier; and Signed and Sealed this Third Day of February, 2009

JOHN DOLL
*Acting Director of the United States Patent and Trademark Office*